United States Patent
Takahashi et al.

(10) Patent No.: US 10,862,404 B2
(45) Date of Patent: Dec. 8, 2020

(54) POWER CONVERSION DEVICE INCLUDING AN ASYMMETRICAL CARRIER SIGNAL GENERATOR

(71) Applicant: Mitsubishi Electric Corporation, Chiyoda-ku (JP)

(72) Inventors: Kenji Takahashi, Chiyoda-ku (JP); Satoshi Kawamura, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 180 days.

(21) Appl. No.: 15/567,186

(22) PCT Filed: Apr. 26, 2016

(86) PCT No.: PCT/JP2016/062969
§ 371 (c)(1),
(2) Date: Oct. 17, 2017

(87) PCT Pub. No.: WO2017/010142
PCT Pub. Date: Jan. 19, 2017

(65) Prior Publication Data
US 2018/0102715 A1     Apr. 12, 2018

(30) Foreign Application Priority Data
Jul. 14, 2015  (JP) ................. 2015-140187

(51) Int. Cl.
*H02M 7/539*     (2006.01)
*H02M 7/5395*    (2006.01)
(Continued)

(52) U.S. Cl.
CPC ........ *H02M 7/5395* (2013.01); *G01R 19/003* (2013.01); *G01R 23/20* (2013.01);
(Continued)

(58) Field of Classification Search
CPC ............ H02M 1/12; H02M 1/14; H02M 7/48; H02M 7/53871; H02M 7/5388;
(Continued)

(56) References Cited

U.S. PATENT DOCUMENTS

2014/0369089 A1* 12/2014 Sakakibara ......... H02M 5/4585
                                                    363/37
2015/0054553 A1*  2/2015 Odagiri ................ H03F 3/217
                                                    327/134
2015/0311800 A1* 10/2015 Katayama ............. H02M 3/158
                                                    323/235

FOREIGN PATENT DOCUMENTS

DE   10 2008 055 875 A1   11/2009
JP        3326790 B2       9/2002
JP        2004180427   *   6/2004   ............. H02M 7/12

OTHER PUBLICATIONS

International Search Report dated Jun. 14, 2016 in PCT/JP2016/062969, filed on Apr. 26, 2016.
(Continued)

*Primary Examiner* — Matthew V Nguyen
(74) *Attorney, Agent, or Firm* — Xsensus LLP

(57) ABSTRACT

Harmonics are generated when pulse width modulation is carried out with an asymmetrical triangular wave as a carrier signal in a power conversion device. In order to restrict these harmonics, a command value is corrected in advance so as to be distorted, a gate signal of a switching operation is determined lasing a post-correction command value and an asymmetrical carrier signal, and pulse width modulation is carried out, whereby an output voltage or output current with no distortion is obtained.

8 Claims, 12 Drawing Sheets

(51) Int. Cl.
   *H02M 7/48*   (2007.01)
   *G01R 19/00*  (2006.01)
   *G01R 23/20*  (2006.01)
   *H02M 1/12*   (2006.01)
   *H03K 7/08*   (2006.01)

(52) U.S. Cl.
   CPC ............... *H02M 1/12* (2013.01); *H02M 7/48* (2013.01); *H03K 7/08* (2013.01)

(58) Field of Classification Search
   CPC ....... H02M 7/75395; H03K 7/00; H03K 7/08; G01R 19/00; G01R 19/003; G01R 23/20
   See application file for complete search history.

(56) References Cited

OTHER PUBLICATIONS

German Office Action dated Jan. 20, 2020 in German Patent Application No. 11 2016 002 716.8 (with English translation), 8 pages.

* cited by examiner

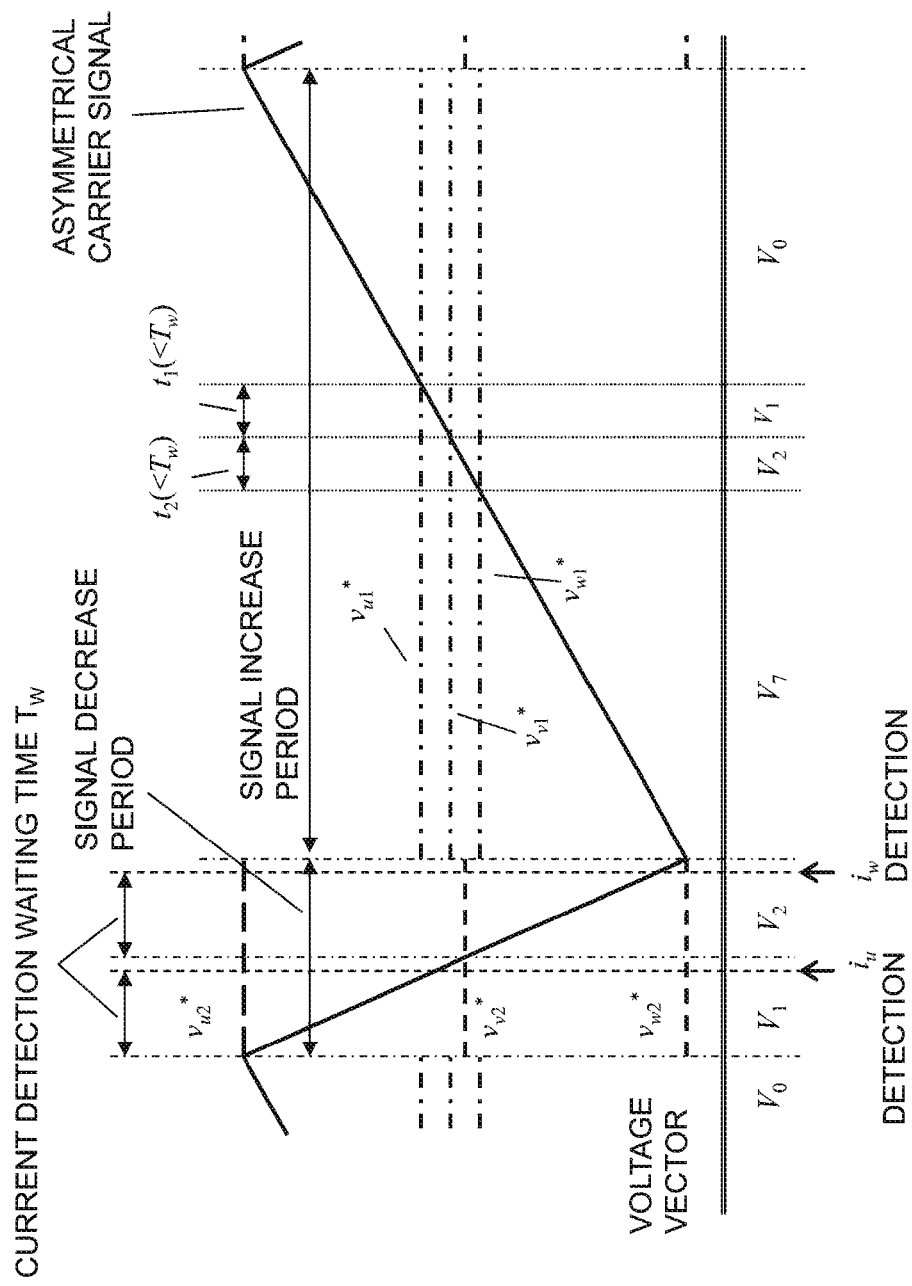

POWER CONVERSION DEVICE INCLUDING AN ASYMMETRICAL CARRIER SIGNAL GENERATOR

TECHNICAL FIELD

The present invention relates to a power conversion device wherein a semiconductor device is used in a switching element, and in particular, relates to a power conversion device wherein a signal with an asymmetrical waveform is used as a carrier signal.

BACKGROUND ART

To date, a power conversion device that converts input power into output power of an arbitrary aspect by a semiconductor device such as an insulated gate bipolar transistor (IGBT), metal-oxide-semiconductor field-effect transistor (MOSFET), or thyristor being caused to switch has been used in various applications.

This power conversion device is such that when distortion is included in input/output, power, the distortion is a cause of instrument noise or vibration, because of which countermeasures that restrict the input/output power distortion are carried out. A pulse width modulation method whereby control is carried out at high speed, and output is brought as near as possible to a sinusoidal wave, is used as one countermeasure. Also, a method known as a carrier comparison method is implemented here in order to generate a switching signal.

The carrier comparison method is a method that determines a switching signal by comparing a high frequency signal, called a carrier signal or carrier wave, and a command value in accordance with voltage or current, and specifically, sets the switching signal to "high" when the command value is greater than the carrier signal, and sets the switching signal to "low" when the command value is smaller than the carrier signal.

A symmetrical triangular wave is normally used for the carrier signal. This "symmetrical triangular wave" is, in particular, a triangular waveform with left-right symmetry such that a signal decrease period necessary for a monotonic decrease from a maximum value to a minimum value, and a signal increase period from a minimum value until monotonically increasing to a maximum value, are equal.

A reason for using a symmetrical triangular wave is that when comparing harmonic components of a symmetrical triangular wave and harmonic components of an asymmetrical triangular wave, the latter has more low-order harmonics in comparison with the former.

However, as a circuit configuration that generates an asymmetrical triangular wave is simpler than a circuit configuration that generates a symmetrical triangular wave, using a triangular waveform such that the signal increase period and signal decrease period are unequal, that is, an "asymmetrical triangular wave", instead of a symmetrical triangular wave is conceivable. When an asymmetrical triangular wave is used as the carrier signal, however, low-order harmonics cause output distortion, because of which, even when using an asymmetrical triangular wave, the asymmetrical triangular wave is adjusted to a symmetrical triangular wave by correcting to a signal with a sawtooth waveform rather than the asymmetrical triangular wave being used as it is as a signal for comparison with the command value, the adjusted symmetrical triangular wave is adopted as the carrier signal, and a comparison with the command value is carried out, as in the details proposed in Patent Document 1, meaning that the asymmetrical triangular wave is not used as it is as the carrier signal.

CITATION LIST

Patent Literature

Patent Document 1: Japanese Patent No. 3,326,790

SUMMARY OF INVENTION

Technical Problem

The existing power conversion device is such that a problem of higher harmonics is envisaged when using a signal with an asymmetrical waveform as the carrier signal, because of which using a symmetrical triangular wave as the carrier signal is considered to be a matter of course. Because of this, no consideration has been given to a power conversion device wherein a signal with an asymmetrical waveform is used as the carrier signal.

The invention has an object of providing a power conversion device such that a signal with an asymmetrical waveform is used as a carrier signal, and higher harmonics of an output waveform can be restricted.

Solution to Problem

A power conversion device of the invention includes a power conversion circuit that carries out power conversion in accordance with a switching operation of a semiconductor device, asymmetrical carrier signal generating means that generates an asymmetrical waveform carrier signal such that a signal decrease period necessary for the carrier signal to change from a maximum value to a minimum value and a signal increase period necessary for the carrier signal to change from the minimum value to the maximum value differ, command value generating means that generates a command value, command value correcting means that receives the asymmetrical carrier signal from the asymmetrical carrier signal generating means and the command value from the command value generating means, corrects the command value based on the asymmetrical carrier signal, and outputs a post-correction command value, and comparison means that compares the post-correction command value from the command value correcting means and the asymmetrical carrier signal, and determines a gate signal of the switching operation of the power conversion circuit.

Advantageous Effects of Invention

According to the power conversion device according to the invention, pulse width modulation is carried out using an asymmetrical carrier signal after a command value is corrected so that a harmonic signal of an order wished to be removed is superimposed, whereby an output waveform with little distortion can be obtained. Because of this, harmonics in an output power waveform of the power conversion device can be restricted, even when a signal with an asymmetrical waveform is used as a carrier signal.

BRIEF DESCRIPTION OF DRAWINGS

FIG. 15 is an illustration that illustrates a principle of a phase current restoration method according to the seventh embodiment of the invention.

DESCRIPTION OF EMBODIMENTS

First Embodiment

Hereafter, based on FIG. 1, a power conversion device according to a first embodiment of the invention will be described.

Figure 1:
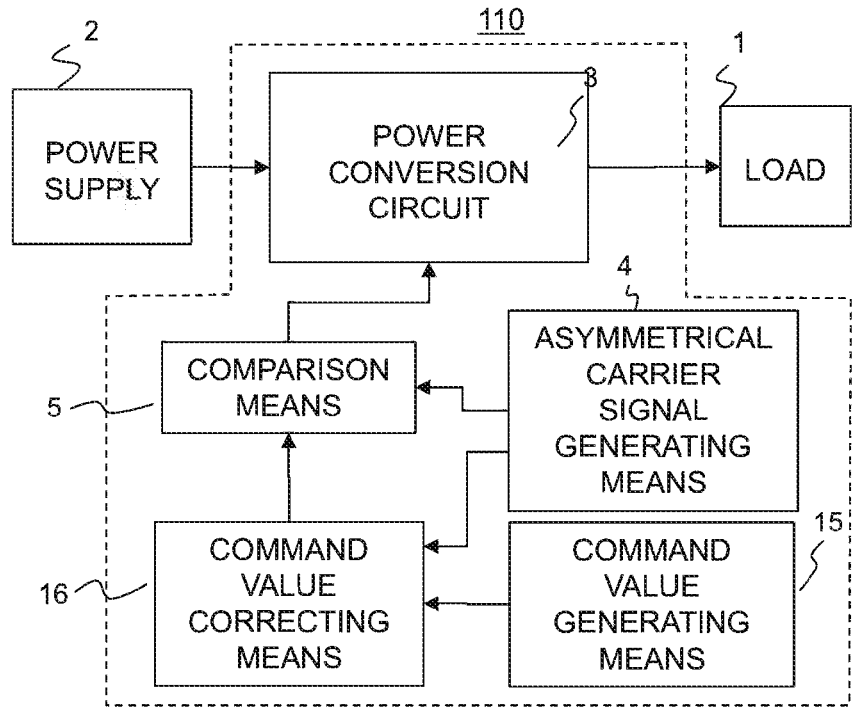
FIG. 1 is a configuration diagram showing a power conversion device of a first embodiment of the invention.

FIG. 1 is a schematic configuration diagram of a power conversion device 110 according to the first embodiment, and represents a configuration of a carrier comparison method that realizes pulse width modulation control.

The power conversion device 110 includes a power conversion circuit 3 wherein a semiconductor device is used as a switching element, comparison means 5 is connected to the power conversion circuit 3, and a gate signal that controls a switching operation is supplied from the comparison means 5 to the power conversion circuit 3.

The comparison means 5 generates a gate signal in accordance with a carrier comparison method, and asymmetrical carrier signal generating means 4 and command value correcting means 16 are connected to the comparison means 5. Also, command value generating means 15, which supplies a command value of a desired waveform, is connected to the command value correcting means 16. A command value signal of a desired waveform is supplied from the command value generating means 15 to the command value correcting means 16, the command value signal is corrected in the command value correcting means 16, and a post-correction command value signal is generated. The correction is carried out in accordance with a state of an asymmetrical triangular wave generated in the asymmetrical carrier signal generating means 4.

Figure 2:
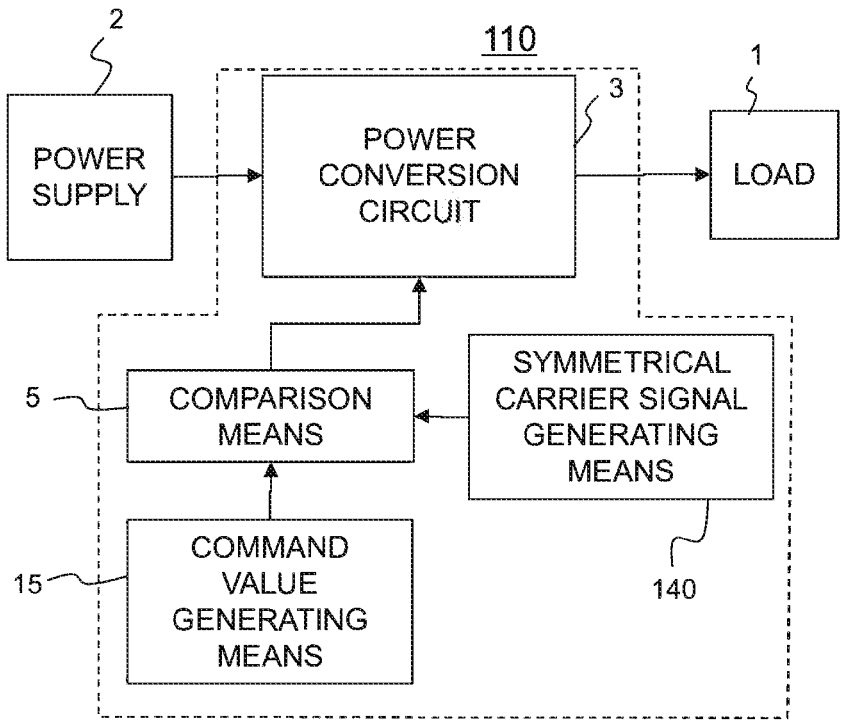
FIG. 2 is a configuration diagram showing a configuration of a power conversion device of a comparative example with respect to the first embodiment of the invention.

In order to clarify a difference between the first embodiment of the invention and existing technology, a schematic configuration of the existing technology is shown in FIG. 2. The configuration shown in FIG. 2 is an existing power conversion device that realizes pulse width modulation control, and the same reference signs are allotted to identical or corresponding portions in the drawings. As shown in the drawing, a difference from the invention is in a configuration connected to the comparison means 5. That is, the configuration shown in FIG. 2 is such that symmetrical carrier signal generating means 140 and the command value generating means 15 are connected to the comparison means 5, a symmetrical triangular wave signal is supplied as a carrier signal from the symmetrical carrier signal generating means 140, and a command signal is supplied unchanged from the command value generating means 15.

As is clear from a comparison of FIG. 1 and FIG. 2, the invention is such that a signal with an asymmetrical waveform is used as a carrier signal, a command value signal is corrected in accordance with a state of the asymmetrical carrier signal to generate a post-correction command value signal, and the post-correction command value signal and carrier signal are compared.

Figure 3A:
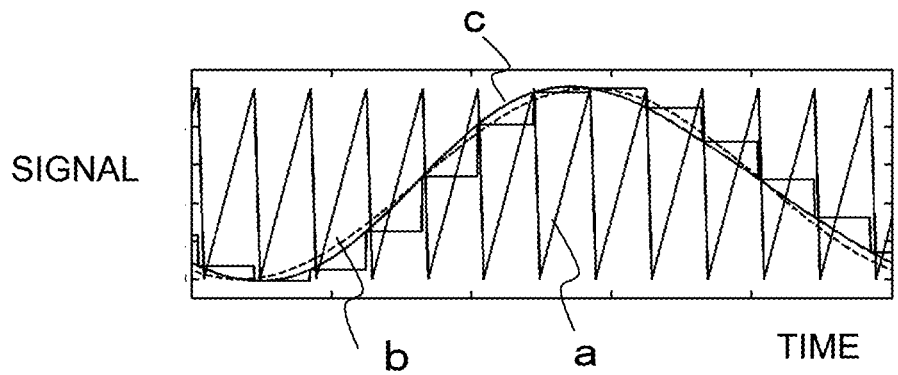
FIG. 3A, FIG. 3B, FIG. 3C are signal waveform diagrams showing an operating state of the power conversion device of the first embodiment of the invention.
Figure 3B:
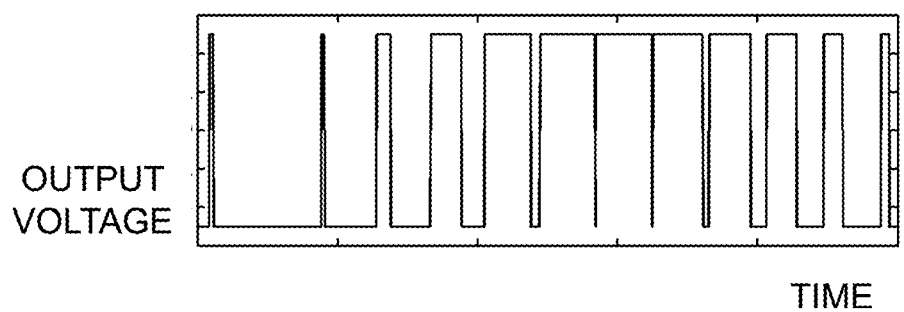
Figure 3C:
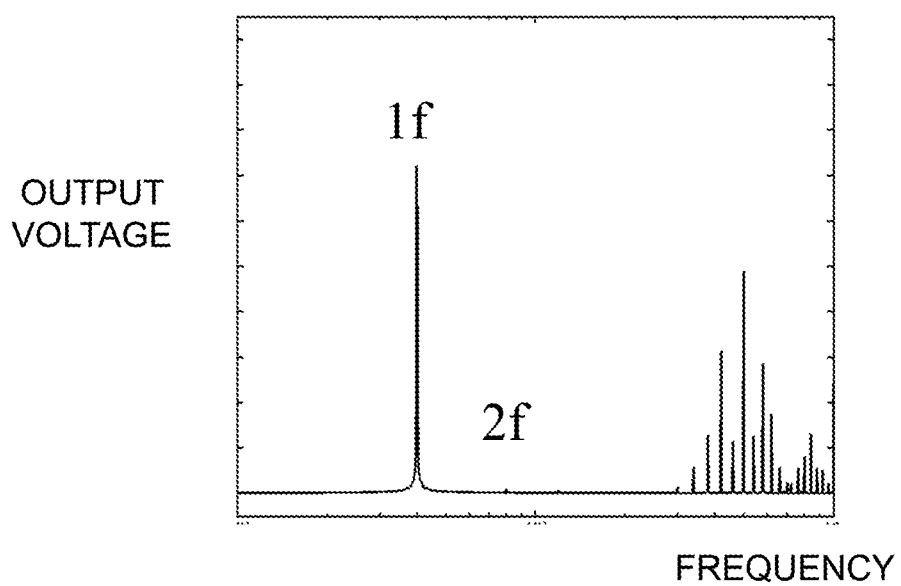

An operating state of the first embodiment shown in FIG. 1 represented by a signal waveform diagram is as in FIGS. 3A, 3B, 3C.

FIG. 3A represents signal states, and in the drawing, a is a carrier signal, and is an asymmetrical triangular wave signal. b is a command value signal of a desired voltage waveform. c represents a post-correction command value signal wherein a second order harmonic of the asymmetrical triangular wave signal a is superimposed on the command value signal b. A stepped waveform in FIG. 3A represents a signal that is the post-correction command value signal c to which a zero-order hold is applied. FIG. 3B represents an output signal (gate signal) obtained by pulse width modulation control using the asymmetrical triangular wave signal a and post-correction command value signal c shown in FIG. 3A. FIG. 3C is a result of a frequency analysis of the output signal shown in FIG. 3B, and as shown here, there is hardly any second order spectrum owing to correction being carried out on the command value signal. In this example, modulation is carried out after only a second order harmonic is superimposed on the command value, but when wishing to restrict a harmonic of another order, it is sufficient that the harmonic of this order is superimposed on the command value. Two or more harmonics of differing orders can, of course, be superimposed simultaneously. Although this method is such that amplitude and phase of a superimposed harmonic are extremely important, these are not so difficult to calculate.

Figure 4A:
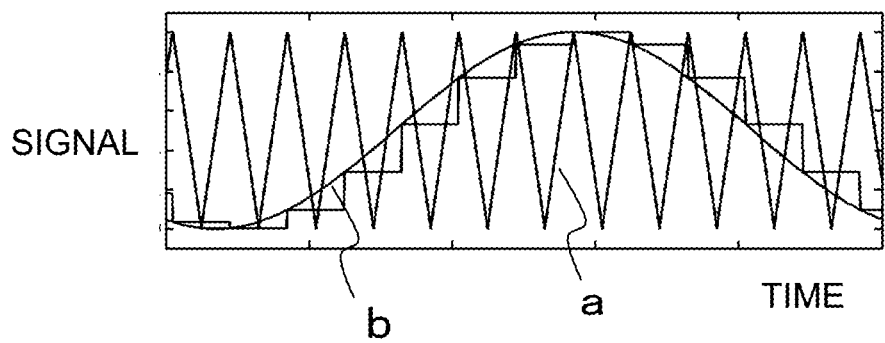
FIG. 4A, FIG. 4B, FIG. 4C are waveform diagrams showing an operating state of the power conversion device of the comparative example with respect to the first embodiment of the invention.
Figure 4B:
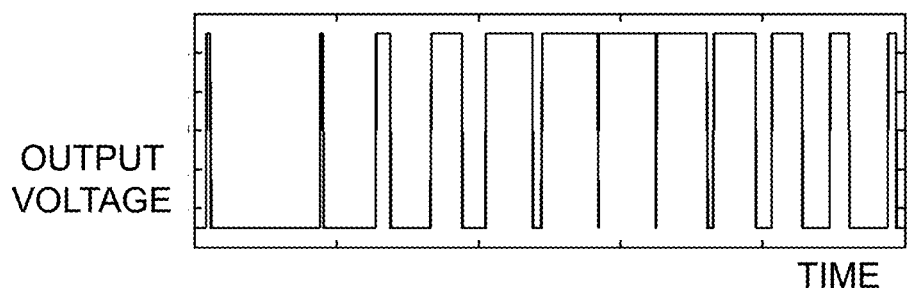
Figure 4C:
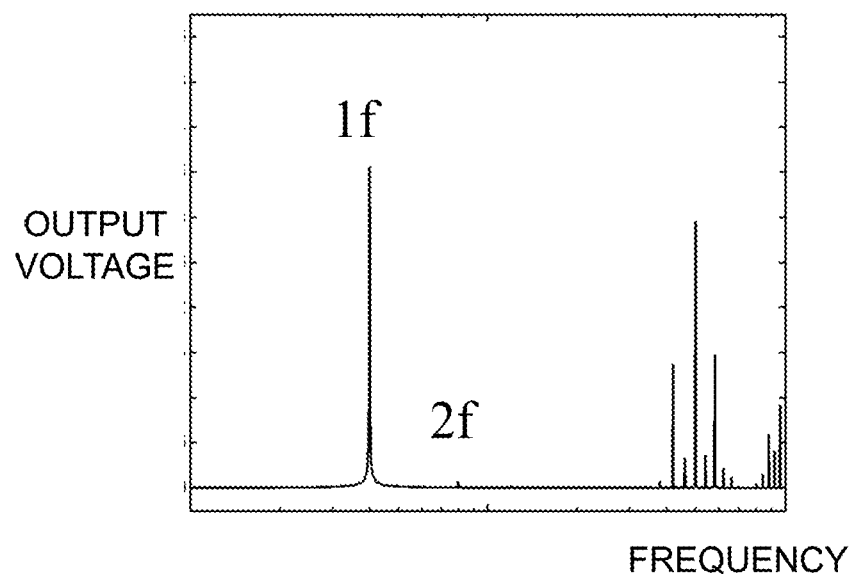

Signal states in the comparative example shown in FIG. 2 are shown in FIGS. 4A, 4B, 4C, in the same way as in FIGS. 3A, 3B, 3C.

FIG. 4A represents signal states, wherein a0 is a carrier signal, and is a symmetrical triangular wave signal. b is a command value signal of a desired voltage waveform. A stepped waveform in FIG. 4A represents a signal that is the post-correction command value signal c to which a zero-order hold is applied. FIG. 4B represents an output signal (gate signal) obtained by pulse width modulation control using the symmetrical triangular wave signal a0 and command value signal b shown in FIG. 4A. FIG. 4C is a result of a frequency analysis of the output signal shown in FIG. 4B, and as shown here, there is hardly any low-order spectrum, although a carrier wave spectrum is included in the output waveform. This is because a symmetrical triangular wave does not have a spectrum of an even numbered order.

Figure 5:
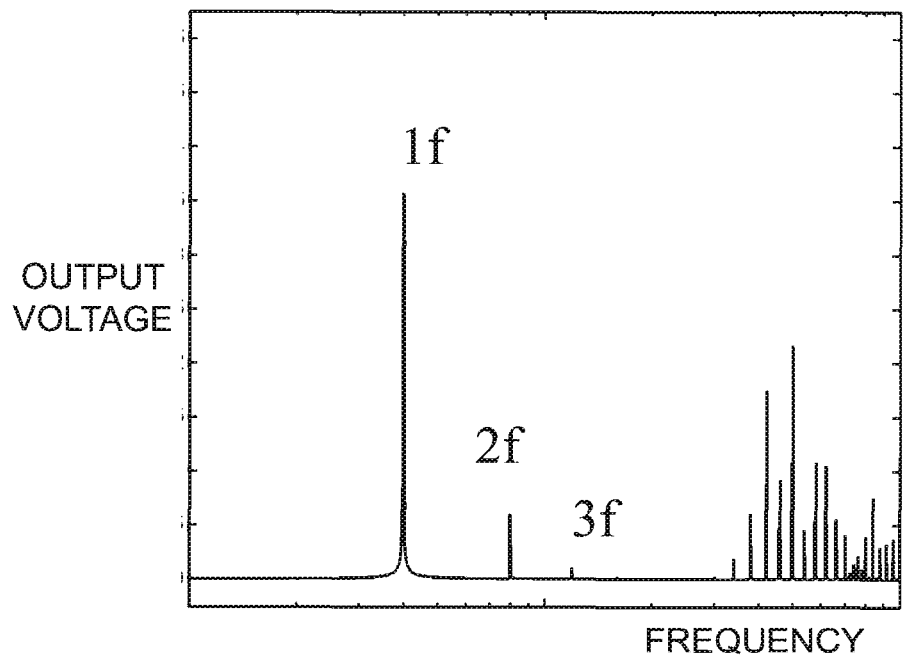
FIG. 5 is a diagram showing a carrier spectrum when using a sawtooth waveform signal as a carrier signal in the power conversion device of the first embodiment of the invention.

FIG. 5 shows a result of a frequency analysis of an output signal when pulse width modulation control is carried out on the symmetrical triangular wave signal using a sawtooth waveform signal, which is one kind of asymmetrical triangular wave, as a carrier signal. As shown in FIG. 5, despite the same conditions as in the case shown in FIGS. 4A, 4B, 4C being adopted for the carrier frequency and the command value amplitude and frequency, the second order harmonic ($2f$) spectrum is noticeably larger in the case of the sawtooth waveform signal, and furthermore, a third order harmonic ($3f$) spectrum also increases. These harmonic spectra increase in magnitude when the carrier frequency and command value frequency are similar, or when a degree of modulation, which is a ratio between the carrier amplitude and command value amplitude, increases.

As can be understood from the first embodiment and comparative example, harmonics exist depending on the signal used as the carrier signal, and the configuration shown in the comparative example uses a carrier in a state of having few harmonics because a problem such as noise occurs due to the harmonics. As opposed to this, it is clear that in the first embodiment an output voltage signal such that the effect of harmonics is restricted can be formed by the command value signal being corrected, even in the case of a carrier signal in which harmonics exist.

Figure 6:
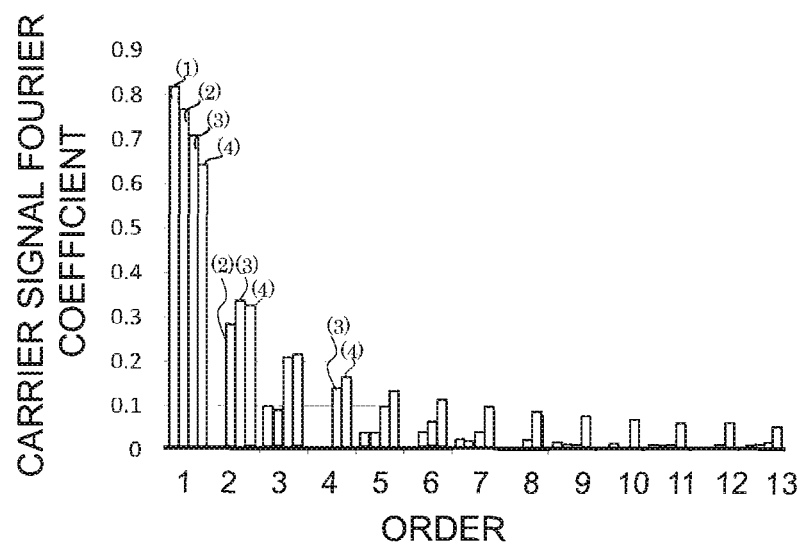
FIG. 6 is a diagram in which Fourier coefficients of a symmetrical triangular wave and asymmetrical triangular waves are compared.

FIG. 6 shows a difference between harmonic components of a symmetrical triangular wave and asymmetrical triangular waves. Herein, Fourier coefficients of a symmetrical triangular wave and three kinds of asymmetrical triangular wave are compared. When comparing spectra of the four kinds of waveform, with ratios between a signal increase period and signal decrease period of 1:1 (the symmetrical triangular wave) (1), 1:3 (2), 1:9 (3), and 1:infinity (a sawtooth waveform) (4), it can be seen that a waveform that is close to having left-right symmetry has a large fundamental wave spectrum, and a harmonic spectrum is small. Because of this, using a symmetrical triangular wave signal as the carrier signal is normally preferable, except in a case in which the command value signal frequency is sufficiently low with respect to the carrier signal frequency. However, by acknowledging the existence of a harmonic component in advance, and assuming that the carrier signal is a carrier signal in which the harmonics exist, an output voltage signal such that the effect of the harmonics is restricted can be obtained by the command value signal being corrected, and a post-correction command value signal being used. Because of this, freedom of design increases, which can be linked to a reduction of a cost price of the circuit configuration.

Second Embodiment

Next, as a second embodiment, a specific configuration of correcting a command value signal will be described.

Figure 7:
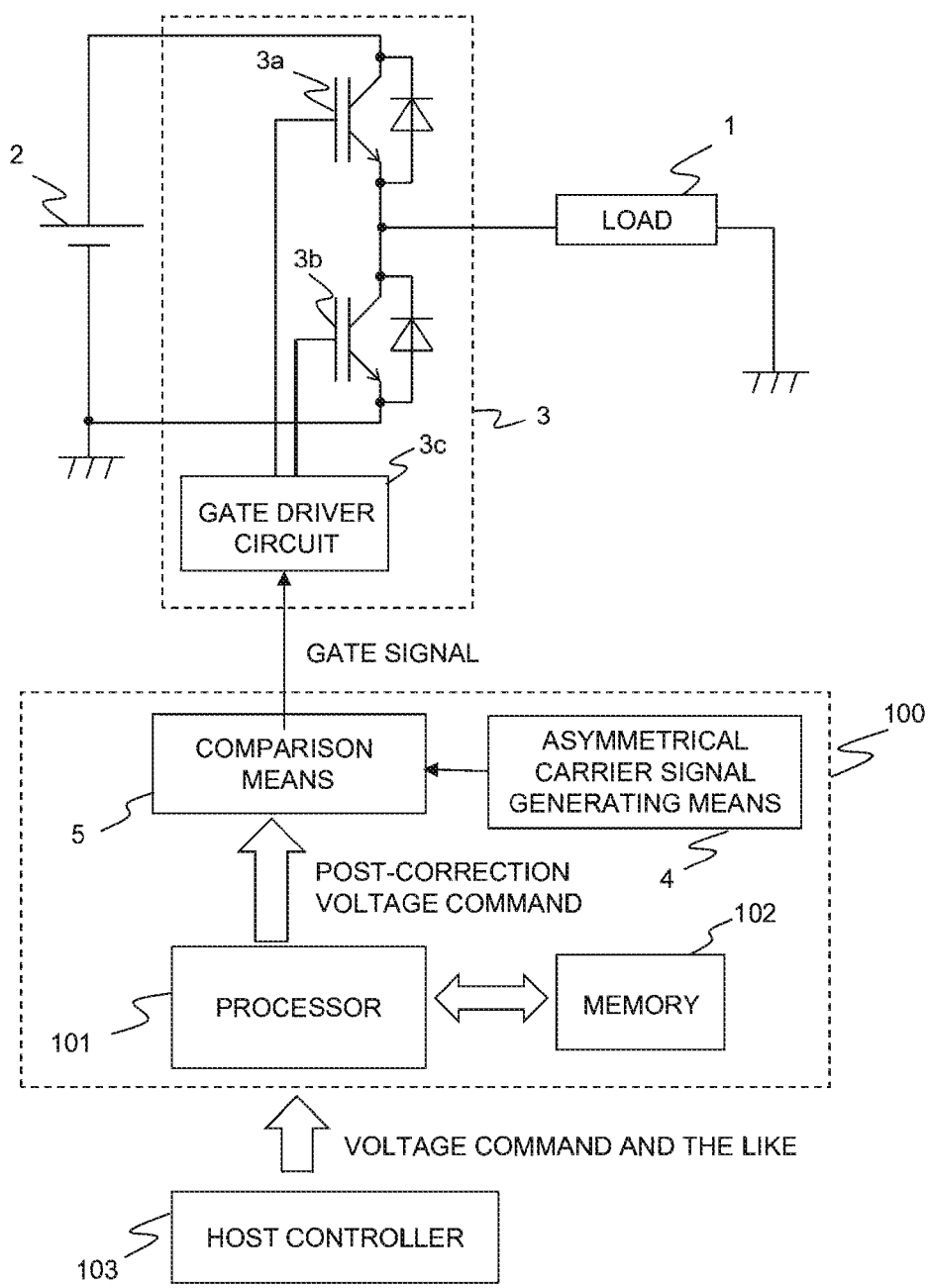
FIG. 7 is a configuration diagram of a power conversion device according to a second embodiment of the invention.

FIG. 7 is a configuration diagram of a power conversion device according to a second embodiment. FIG. 7 will be described allotting the same reference signs to portions identical to or corresponding to those in the configuration shown in FIG. 1. In FIG. 7, a voltage type single phase inverter is shown as the power conversion device 110. The power conversion device 110 includes the power conversion circuit 3, a control device 100 of the power conversion circuit 3, and a host controller 103. The host controller 103 transmits a command value of voltage or current to the control device 100 of the power conversion circuit 3. When a load 1 is a motor, the host controller 103 may also provide the control device 100 with a speed command or position command. The power conversion device 110 operates based on the command value.

The control device 100 of the power conversion circuit includes as hardware the asymmetrical carrier signal generating means 4, the comparison means 5, a processor 101, and a memory 102. Although not shown, the memory 102 includes a volatile storage device such as a random access memory and a non-volatile auxiliary storage device such as a flash memory. Although not shown, the memory 102 may equally well include a volatile storage device such as a random access memory, and an auxiliary storage device such as a hard disk instead of a non-volatile auxiliary storage device. The processor 101 executes a program input from the memory 102. As the memory 102 includes an auxiliary storage device and a volatile storage device, the program is input into the processor 101 from the auxiliary storage device via the volatile storage device. Also, the processor 101 may output data such as a computation result to the volatile storage device of the memory 102, or may save the data in the auxiliary storage device via the volatile storage device.

Although not shown here, the device may further have current detection means, which detects current flowing into the power conversion circuit, and voltage detection means, which detects voltage applied to the power conversion circuit. Numerals acquired by the current detection means and voltage detection means may be transmitted to the processor 101 or memory 102.

The asymmetrical carrier signal generating means 4 generates an asymmetrical carrier signal. A carrier signal that does not have left-right symmetry, wherein a signal decrease period necessary for a monotonic decrease from a maximum value to a minimum value and a signal increase period from a minimum value until monotonically increasing to a maximum value are unequal, is called an "asymmetrical carrier signal". A typical example of an asymmetrical triangular wave is a sawtooth waveform.

The processor 101 determines a post-correction voltage command, which is a corrected voltage command, in order to restrict, a harmonic generated by the asymmetrical carrier signal. That is, the processor 101 corresponds to the command value correcting means 16 shown in the first embodiment and, although not shown, obtains information relating to the asymmetrical carrier signal generated from the asymmetrical carrier signal generating means 4, and determines the post-correction voltage command.

The comparison means 5 compares the asymmetrical carrier signal and post-correction voltage command, and determines a gate signal of the power conversion circuit 3. In this embodiment, the power conversion circuit 3 is a single phase inverter circuit, because of which semiconductor switches 3a and 3b are switched in a complementary way in order to convert a direct current voltage of a power supply 2 into an arbitrary voltage, and apply the voltage to the load 1. As an input/output interface of the processor is often not furnished with the capacity to drive a large capacity semiconductor switch, a gate driver circuit 3c is used in this case. In FIG. 7, the semiconductor switches 3a and 3b are IGBTs, but as there is no intention to limit the invention to this, the semiconductor switches 3a and 3b may be power transistors or FETs.

Third Embodiment

Figure 8:
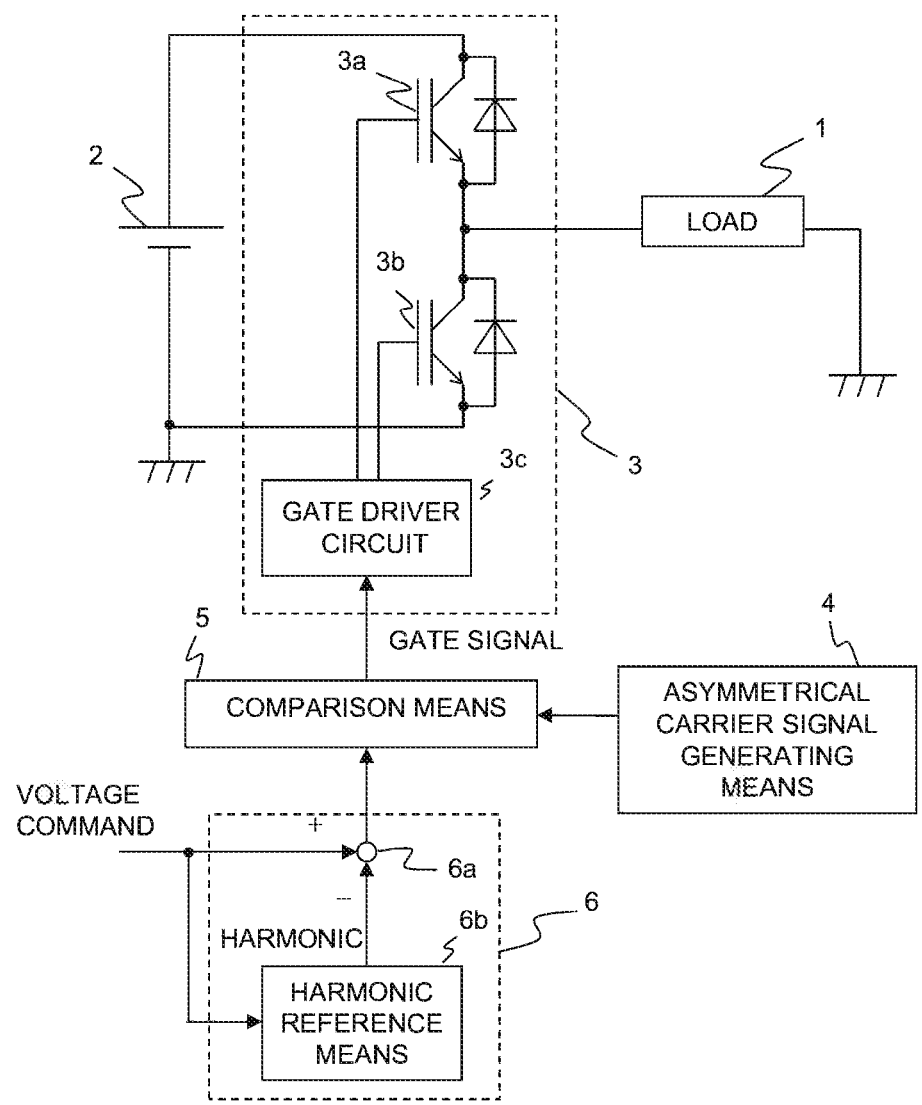
FIG. 8 is a configuration diagram of a power conversion device according to a third embodiment of the invention.

FIG. 8 is a diagram showing a configuration of a power conversion device according to a third embodiment of the invention. The control device 100 of the power conversion circuit includes the asymmetrical carrier signal generating means 4, the comparison means 5, and harmonic voltage distortion correcting means 6. The harmonic voltage distortion correcting means 6 shown in FIG. 8 is realized by the processor 101 that executes the program stored in the memory 102 shown in FIG. 7, or by an unshown processing circuit such as a system LSI. Also, the previously described function may be executed by a multiple of the processor 101 and a multiple of the memory 102 being coordinated, or the previously described function may be executed by a multiple of processing circuits being coordinated. Also, the previously described function may be executed by coordination using a combination of a multiple of the processor 101 and a multiple of the memory 102 with a multiple of processing circuits.

The harmonic voltage distortion correcting means 6 of FIG. 8 is configured of a subtractor 6a and harmonic reference means 6b that references a harmonic generated from a voltage command by an asymmetrical carrier signal, determines a post-correction voltage command by subtracting a harmonic signal from the voltage command, corresponds to the command value correcting means 16 shown in the first embodiment and, as described in the previous embodiment, receives information relating to the asymmetrical carrier signal and corrects the voltage command value, thereby determining the post-correction voltage command.

When pulse width modulating a sinusoidal command value signal as it is using an asymmetrical carrier signal, a harmonic included in the output signal increasing when the command value signal frequency nears the carrier signal frequency is as already described, but expressing this mathematically can be described as follows.

When a voltage command Vref is provided as in Expression (1), and modulation is carried out using an asymmetrical carrier signal, a voltage Vload applied to the load 1 can be expressed as in Expression (2).

(Math. 1)

Math. 1

$$V_{ref}=V_f \cdot \exp(j(\omega t+\theta_i))$$ Expression (1)

(Math. 2)

Math. 2

$$V_{load}=V_{ref}+V_{2h} \cdot \exp(j(2\omega t+\theta_2))+V_{3h} \cdot \exp(j(3\omega t+\theta_3))+ \ldots +V_{carrier}$$ Expression (2)

Herein, Vf represents voltage command amplitude, ω is voltage command angular frequency, θ1 is a voltage command phase, exp is an exponential function with Napier's constant as a base, j is a complex number, V2h and V3h are second order harmonic and third order harmonic amplitudes, θ2 and θ3 are second order harmonic and third order harmonic, phases, and Vcarrier is a sum of carrier spectrum voltages.

By carrying out pulse width modulation after distorting the command value signal in advance, a harmonic included in the output signal can be removed, correction of the voltage command value is carried out as in Expression (3), and a post-correction voltage command value Vref2 is modulated using an asymmetrical carrier signal. Correction of a second order harmonic component is carried out in Expression (3), whereby the second order harmonic component is removed from the voltage Vload applied to the load 1, as shown in Expression (4).

(Math. 3)

Math. 3

$$V_{ref2}=V_{ref}-V_{2h} \cdot \exp(j(2\omega t+\theta_2))$$ Expression (3)

(Math. 4)

Math. 4

$$V_{load} \cong V_{ref}+V_{3h} \cdot \exp(j(3\omega t+\theta_3))+ \ldots +V_{carrier}$$ Expression (4)

Herein, the second order harmonic amplitude V2h and phase θ2 are determined based on a voltage expected to be applied to the load 1 when no correction is carried out.

Figure 9:
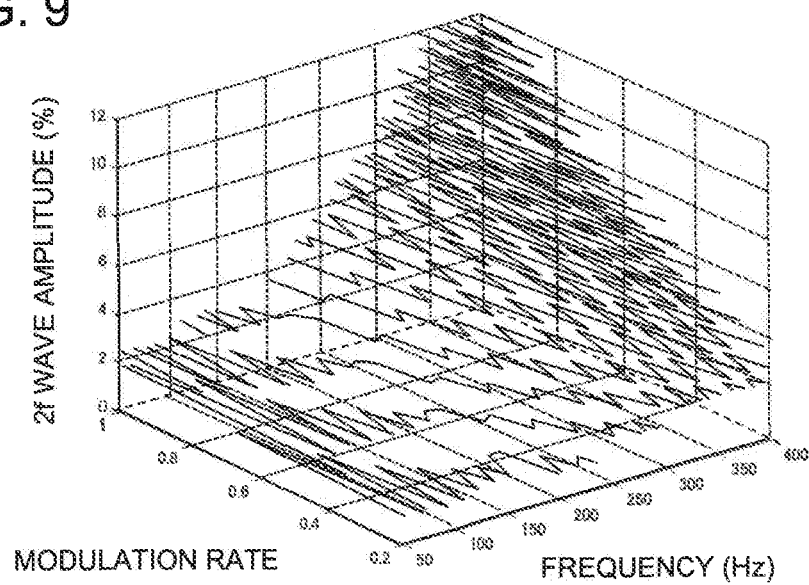
FIG. 9 is an illustration of an amplitude spectrum of harmonic reference means of the power conversion device according to the third embodiment of the invention.

FIG. 9 is an illustration for describing an amplitude spectrum of the harmonic reference means 6b shown in the power conversion device according to the third embodiment of the invention. This is an example of a result of calculating a second order harmonic amplitude spectrum generated when a sinusoidal signal is pulse width modulated using a certain asymmetrical carrier signal. For example, taking the carrier signal frequency to be 5 kHz, when a modulation rate, which is an amplitude ratio between the sinusoidal signal and carrier signal, and the sinusoidal signal frequency are changed, a second order harmonic component included in a pulse width modulation control signal changes as in FIG. 9.

A high-speed Fourier conversion algorithm is used in the calculation of FIG. 9, but when a high-speed Fourier conversion is carried out, a harmonic amplitude spectrum and phase spectrum are obtained simultaneously, because of which correction is carried out by subtracting the harmonic signal obtained from the voltage command. By obtaining the kind of calculation result in FIG. 9 using a calculator simulation, voltage command value signal correction is carried out based on the calculation result shown in FIG. 9 in the third embodiment.

The harmonic reference means 6b of FIG. 8, for example, based on the voltage command value signal frequency and the modulation rate, references a harmonic component generated by an asymmetrical carrier signal in, for example, a look-up table stored in a storage device like the memory 102 shown in the second embodiment, and outputs the calculation result shown in FIG. 9 to the subtractor 6a with the harmonic component as a corrective signal. Correction that distorts the voltage command value in advance is carried out by the corrective signal, that is, the harmonic component, being subtracted from the voltage command value in the subtractor 6a. The post-correction voltage command is pulse width modulated using the asymmetrical carrier signal, as a result of which harmonic distortion is removed from the voltage applied to the load 1.

Figure 10:
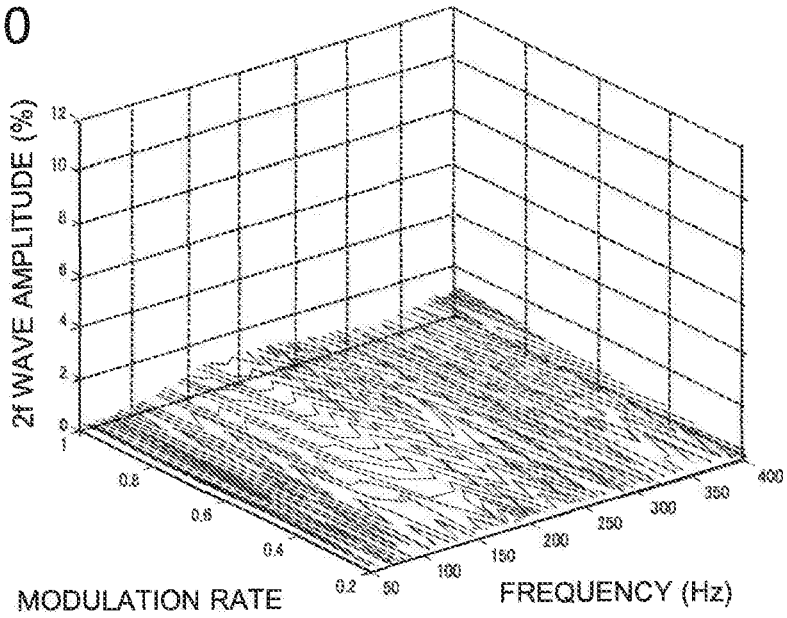
FIG. 10 is an illustration showing an advantage of harmonic voltage distortion correcting means of the power conversion device according to the third embodiment of the invention.

FIG. 10 is an illustration showing an advantage of the harmonic voltage distortion correcting means 6 of the power conversion device 110 according to the third embodiment of the invention, and summarizes a result of Fourier converting an output signal when implementing the invention. In FIG.

9, depending on the conditions, a second harmonic distortion exceeding 10% of the magnitude of a fundamental wave amplitude occurs, but by implementing the invention, the second harmonic distortion of the output signal can be suppressed to in the region of 1%.

In this way, in the third embodiment of the invention, output waveform harmonics can be restricted even when an asymmetrical triangular wave is used as the carrier signal, and a problem relating to harmonics, which is a disadvantage of an asymmetrical carrier signal, can be resolved using extremely simple means. Also, although a description has been given here of a case in which a simple sinusoidal signal is pulse width modulated using an asymmetrical carrier signal, a third order harmonic signal can be superimposed on the sinusoidal signal in order to improve a voltage utilization rate in a voltage type 3-phase inverter circuit, and by recalculating the harmonic spectrum and correcting the command value signal, a practically effective measure can be achieved.

In the third embodiment, a description has been given of calculating a harmonic spectrum in advance, and storing the harmonic spectrum in a look-up table, in order to carry out voltage command correction, but when there is leeway in a computing performance of a calculator, the harmonic spectrum may be calculated in real time in an interior of the processor 101 of the second embodiment. In a kind of case in which a ratio between asymmetrical carrier signal frequency or signal increase period and signal decrease period frequently changes, an amount of data to be stored in the memory 102 increases, because of which there may be a case in which calculating the harmonic spectrum in real time in the interior of the processor 101 is better.

Fourth Embodiment

Figure 11:
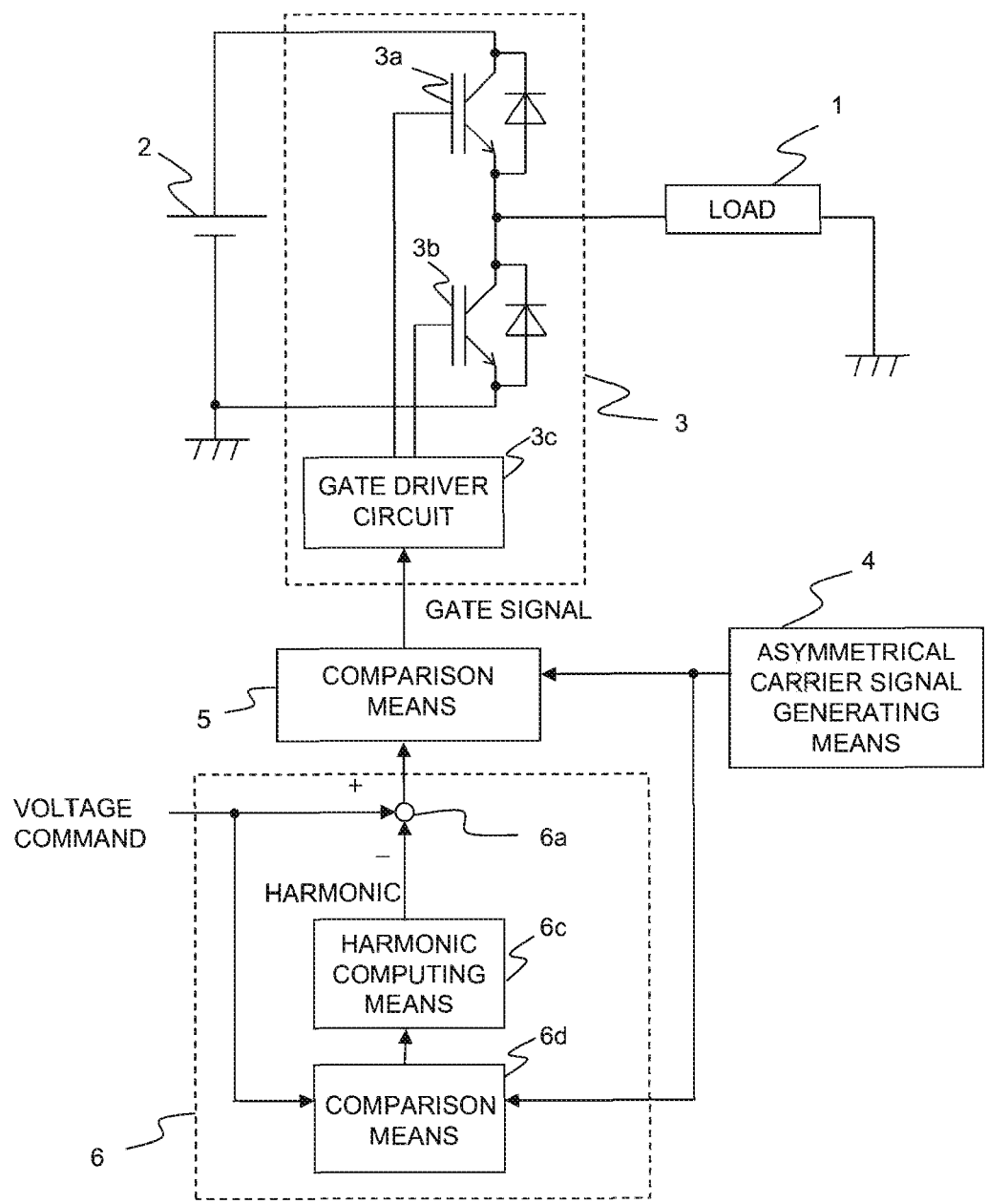
FIG. 11 is a configuration diagram of a power conversion device of a fourth embodiment of the invention.

FIG. 11 is a configuration diagram of the power conversion device 110 of a fourth embodiment of the invention. As a difference from the third embodiment, the harmonic voltage distortion correcting means 6 is configured of the subtractor 6a, comparison means 6d that pulse width modulates a voltage command using an asymmetrical carrier signal, and harmonic computing means 6c that calculates a harmonic spectrum by Fourier converting a pulse train generated by the comparison means 6d. A post-correction voltage command is determined by a harmonic signal being subtracted from the voltage command in the harmonic voltage distortion correcting means 6.

As one example of a method of calculating a harmonic spectrum, there is a method whereby a pulse obtained as a result of pulse width modulation is actually Fourier converted. Other than this, there is a calculation method that uses a complex double Fourier series or switching function. Actually, a harmonic is more easily obtained by actually Fourier converting the pulse, because of which it is taken that the harmonic computing means 6c simply computes and outputs a harmonic.

Herein, an output of a pulse width modulation is obtained by an output of the asymmetrical carrier signal generating means 4 and the voltage command being compared in the comparison means 6d, a harmonic is computed based on the output signal in the harmonic computing means 6c and a harmonic signal calculated, and a post-correction command signal is generated by the calculated harmonic signal being subtracted from the voltage command signal in the subtractor 6a. In the third embodiment, a harmonic is set using the harmonic reference means 6b, as opposed to which, the harmonic is calculated here by calculating in real time in the harmonic computing means 6c. Because of this, the amount of data saved can be reduced, even when the carrier signal waveform is frequently changed.

Fifth Embodiment

In the second to fourth embodiments, a feed forward control type of configuration is shown, but harmonic distortion due to an asymmetrical carrier signal can also be restricted by feedback control.

Figure 12:
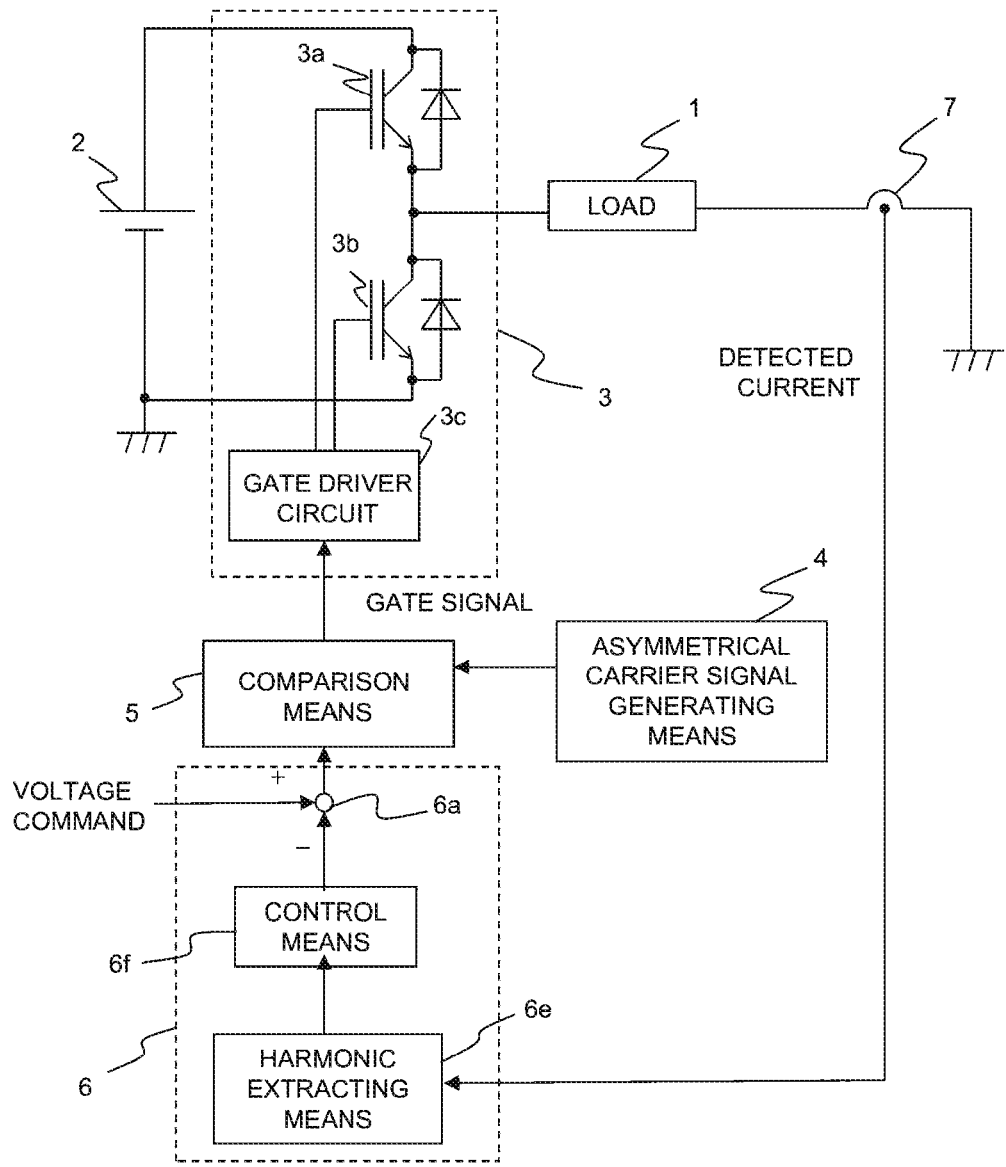
FIG. 12 is a configuration diagram of a power conversion device of a fifth embodiment of the invention.

FIG. 12 is a configuration diagram of a power conversion device according to a fifth embodiment of the invention. In FIG. 12, a configuration is such that current detecting means 7 is newly included, harmonic current distortion occurring due to an asymmetrical carrier signal is extracted in harmonic extracting means 6e from a detected current or detected voltage obtained by the current detecting means 7, and a voltage command is corrected based on the harmonic current distortion. A method using Fourier conversion can be used as a specific harmonic extraction method.

Voltage detecting means may be included instead of the current detecting means 7. Of course, both the current detecting means 7 and voltage detecting means may be included, and the voltage command may be corrected using both voltage and current of the power conversion circuit 3. A correction value is determined in control means 6f provided in the harmonic voltage distortion correcting means 6, but this is configured of, for example, a PID controller. A PID controller is one kind of controller that, with e as a deviation, automatically adjusts a control amount y so that the deviation e between a command value r and a detected value x is zero. A control equation of the PID controller is generally expressed by Expression (5) and Expression (6).

(Math. 5)

Math. 5

$$e = r - x \qquad \text{Expression (5)}$$

(Math. 6)

Math. 6

$$y = K_p e + k_I \!\int\! e\, dt + K_D d/dt\; e \qquad \text{Expression (6)}$$

Herein, Kp is proportional gain, KI is integral gain, and KD is derivative gain. Speed and stability of convergence on a command value change by gain being changed in the PID controller. Various methods have been proposed as a gain adjustment method.

For example, a detailed description will be given of a method of configuring the control means 6f when a cosine component 12c and sine component 12s of a second order harmonic included in current flowing to the load 1 are known by the current detecting means 7 and harmonic extracting means 6e (this corresponds to the amplitude and phase of the second order harmonic included in the current being known). Although these second order harmonics are desirably both zero, what kind of second order harmonic to superimpose on a voltage command when correcting the voltage command is a problem.

Provided that impedance of the load 1 is already known, a second order harmonic voltage to be superimposed is easily reverse calculated. However, such means cannot be employed when the impedance is unknown, or when the impedance fluctuates due to a disturbance factor such as temperature fluctuation.

With regard to this kind of case, it is good to determine a corrective voltage using two PID controllers. A first PID controller is for controlling the cosine component 12c of the second order harmonic current to zero, and determines the cosine component of the second order harmonic voltage to be superimposed. A second PID controller is for controlling the sine component 12s to zero, and determines the sine component of the second order harmonic voltage to be superimposed. Provided that, the cosine component and sine component are known, the second order harmonic amplitude V2h and phase θ2 shown in Expression (3) can be calculated, because of which it is then sufficient that the same kind of correction as in the second and third embodiments is carried out.

As this method is such that a command value is manipulated so that harmonic distortion decreases while current and voltage are detected, the method is also effective in a case in which there is a disturbance factor other than an asymmetrical carrier signal such that harmonic distortion increases.

Sixth Embodiment

In the second and third embodiments, feed forward compensation and feedback compensation have been described individually, but feed forward compensation and feedback compensation can, of course, be used concurrently.

Figure 13:
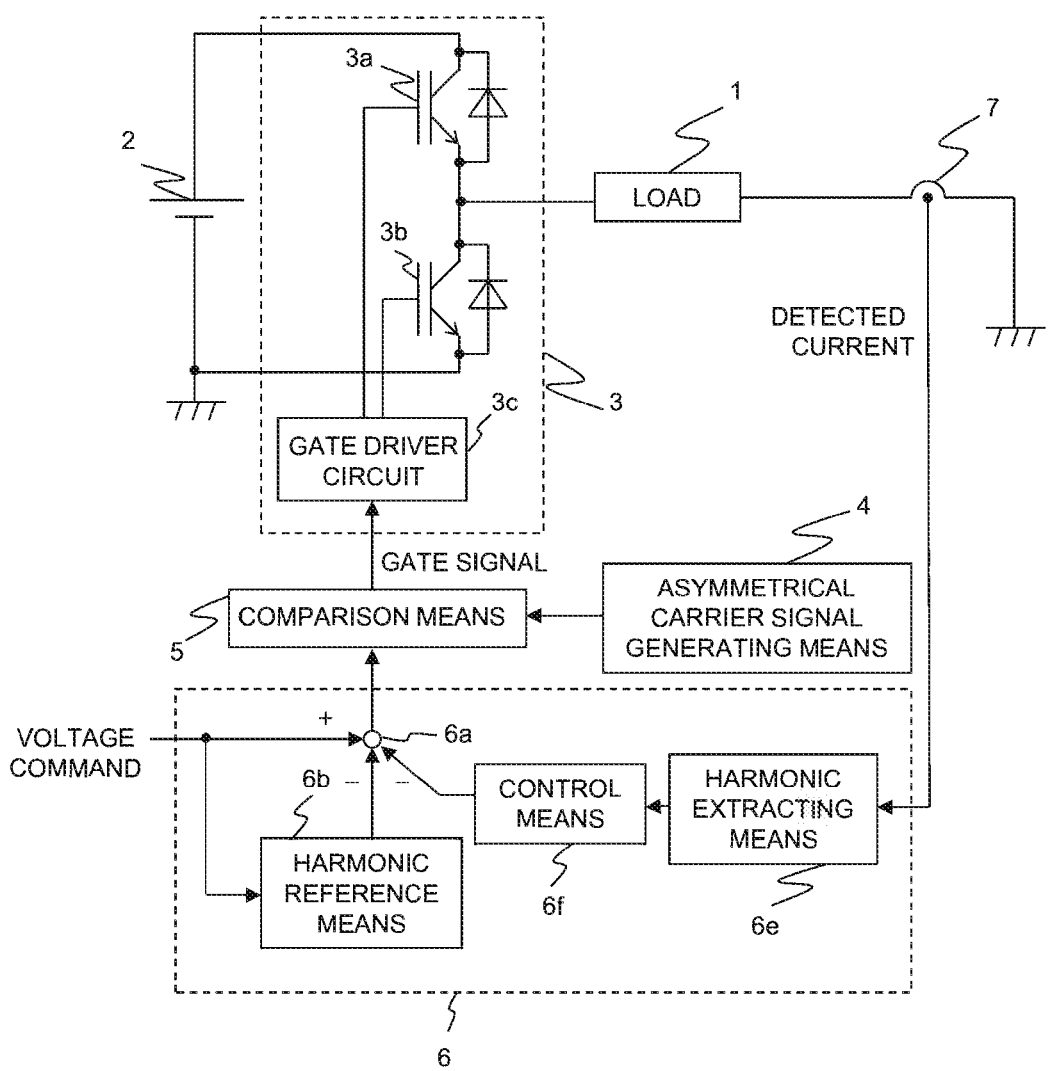
FIG. 13 is a configuration diagram of a power conversion device of a sixth embodiment of the invention.

FIG. 13 is a configuration diagram of a power conversion device of a sixth embodiment, of the invention. In FIG. 13, the current detecting means 7 and harmonic voltage distortion correcting means 6 are included, the harmonic reference means 6b, harmonic extracting means 6e, and control means 6f are included as contents of the harmonic voltage distortion correcting means 6, and both the feed forward compensation described in the third embodiment and feedback compensation described in the fifth embodiment are being carried out. That is, as described in the third embodiment, command signal correction can be carried out more reliably by these two kinds of control system being used in combination based on the command signal, because of which a harmonic can be more effectively reduced.

Seventh Embodiment

Figure 14:
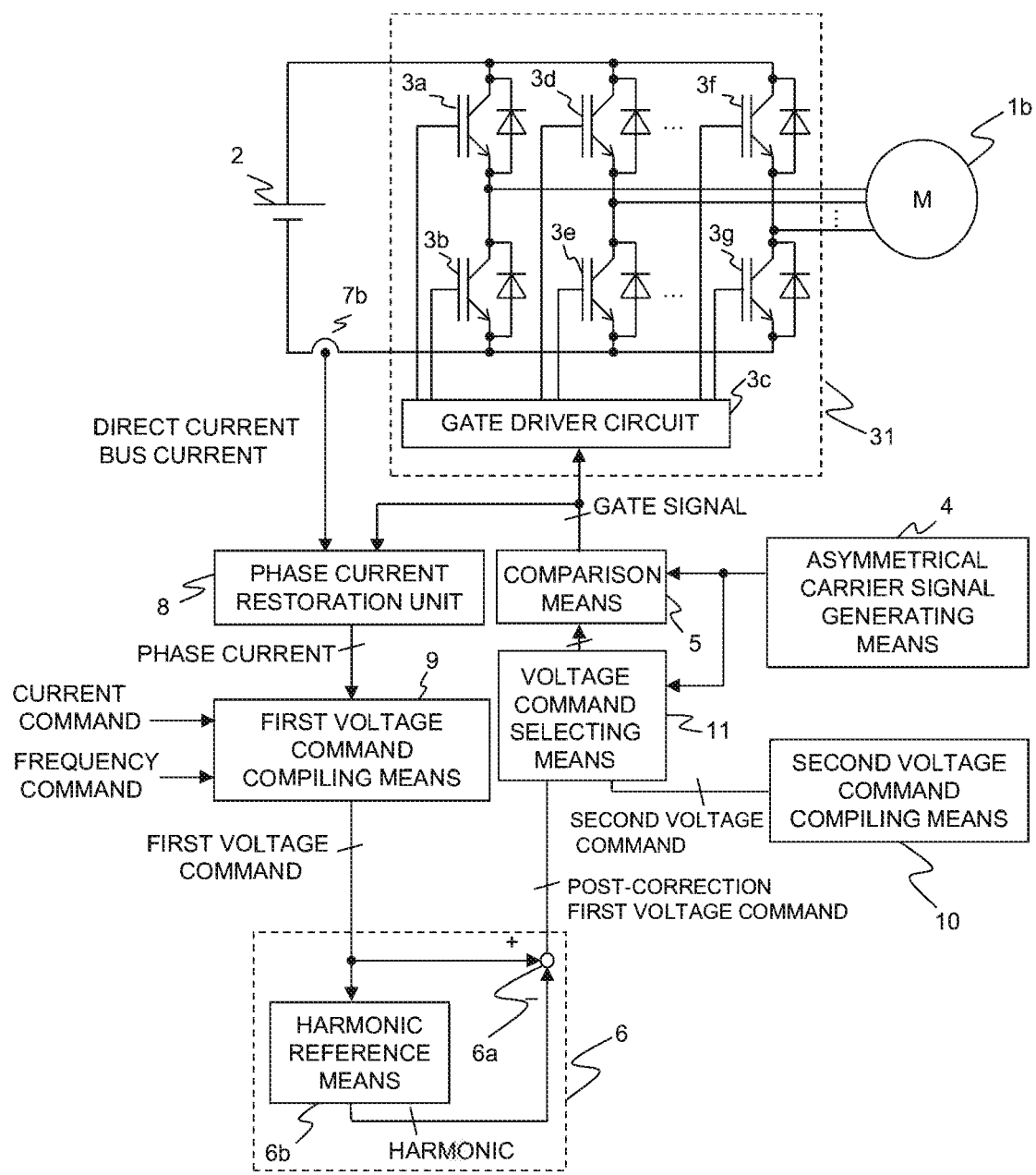
FIG. 14 is a configuration diagram of a power conversion device according to a seventh embodiment of the invention.

FIG. 14 is a diagram showing a configuration of a power conversion device according to a seventh embodiment of the invention.

The seventh embodiment is such that a power conversion device that carries out the pulse width modulation using an asymmetrical carrier signal described in the first to sixth embodiments is used, and furthermore, a one-shunt current detection is carried out. Because of this, a multi-phase power conversion circuit 31 is a DC-AC converter that can supply direct current power and multi-phase alternating current in two directions, and includes direct current bus current detecting means 7b, which detects direct current bus current flowing to a direct current bus side, and a phase current restoration unit 8, which restores multi-phase alternating current flowing to a multi-phase alternating current side from a switching pattern of the DC-AC converter and the direct current bus current.

That is, as shown in FIG. 14, a first voltage command is compiled in first voltage command compiling means 9 based on a separately supplied current, command and frequency command. The first voltage command is such that voltage distortion due to a harmonic is corrected, and a post-correction first voltage command set, in the harmonic voltage distortion correcting means 6.

Meanwhile, a second voltage command, wherein a current detection waiting time necessary in order to restore the multi-phase alternating current is secured, is output in second voltage command compiling means 10.

Further, a configuration is such that when the post-correction first voltage command and the second voltage command prepared in order to reliably restore the current are output, alternately, the first voltage command is output in the longer period of a signal increase period and signal decrease period of an asymmetrical carrier signal, and the second voltage command, wherein the current detection waiting time necessary in order to restore the multi-phase alternating current is secured, is output in the shorter period.

Although controlling power supplied to a load is the role of the first voltage command, a output voltage of the inverter is determined by a time average that takes both the first voltage command and second voltage command into consideration. In many cases, vector directions of the first voltage command and second voltage command do not coincide, meaning that the longer a period for which the second voltage command is output, the further a maximum voltage the inverter can output decreases.

In the seventh embodiment, the output period of the second voltage command is shortened as far as possible by using an asymmetrical carrier signal, whereby a power supply voltage utilization rate is increased.

In the seventh embodiment, a multi-phase motor 1b is the load, and in order to drive the multi-phase motor 1b into a desired state, a switching operation of the multi-phase power conversion circuit 31 is controlled by the gate driver circuit 3c, and phase current flowing into the multi-phase motor 1b is restored from a direct current bus current detected by the direct current bus current detecting means 7b and a gate signal of the multi-phase power conversion circuit 31. The restoration of the phase current is carried out in the phase current restoration unit 8.

The first voltage command is a command signal for controlling an amplitude and frequency of the phase current of the multi-phase motor 1b to desired values, and is determined in the first voltage command compiling means 9 based on a current command and frequency command. This determination can be carried out using a general current control method such as vector control. The first voltage command is corrected by the harmonic voltage distortion correcting means 6, and the post-correction first voltage command is generated. Further, which voltage command of the post-correction first voltage command and second voltage command is to be transmitted to the comparison means 5 is selected in voltage command selecting means 11.

When the post-correction first voltage command is sent to the comparison means 5, a gate signal is determined by an asymmetrical carrier signal from the asymmetrical carrier signal generating means 4, the multi-phase power conversion circuit 31 operates, and power is supplied to the multi-phase motor 1b, whereby the multi-phase motor 1b is driven.

When the second voltage command is sent to the comparison means 5, a command to detect direct current bus current is output from the comparison means 5 to the multi-phase power conversion circuit 31 and phase current, restoration unit 8.

Next, a description will be given of a basic structure of phase current restoration in the seventh embodiment.

Upper and lower switches of a voltage-type 3-phase inverter basically operate in a complementary way. That is, when upper side switches of the multi-phase power conversion circuit 31 are on, lower side switches are off, and when the lower side switches are on, the upper side switches are off. Also, a current path of a voltage-type 3-phase inverter is determined by a gate signal, so that when, for example, a u-phase upper side gate signal is on and v-phase upper side and w-phase upper side gate signals are off, the inverter outputs a voltage vector called V1, but current flowing into a direct current bus portion of the inverter is equivalent to a u-phase current of a 3-phase motor. Consequently, when direct current bus current is detected when the voltage vector V1 is being output, a value of the u-phase current can be obtained. Also, when the u-phase upper side and v-phase upper side gate signals are on and the w-phase upper side gate signal is off, the inverter outputs a voltage vector called V2, but the current flowing into the direct current bias portion of the inverter is equivalent to a w-phase current of the 3-phase motor.

Consequently, when the direct current bus current is detected when the voltage vector V2 is being output, a value of the w-phase current can be obtained. Although eight combinations of switch state exist in a voltage-type three-phase inverter, current of any phase can be detected with six kinds of those combinations. As a switch combination such that phase current cannot be detected is a combination wherein the u-phase upper side, v-phase upper side, and w-phase upper side gate signals are all the same, there are two kinds, those being when the upper side switches are all off and when the upper side switches are all on. Voltage vectors output at these times are called V0 and V7 respectively, but when V0 or V7 is being output, phase current flowing into the motor flows back inside the motor, because of which current basically does not flow into the direct current bus portion of the inverter. Further, when two phases of phase current can be restored, the current of the remaining phase can be calculated using Kirchhoff's current law. Utilizing this, and provided that the direct current bus current is detected with good timing, all three phases of phase current flowing into the motor can be detected with a single current sensor.

FIG. 15 is an illustration that illustrates a principle of a phase current restoration method according to the seventh embodiment of the invention. In this embodiment, control is carried out while post-correction first voltage commands Vu1*, Vv1*, and Vw1*, which are such that a harmonic voltage distortion correction has been implemented on a first voltage command for current control, and second voltage commands Vu2*, Vv2*, and Vw2* suited to current detection are selected as appropriate.

In FIG. 15, a signal decrease period of an asymmetrical carrier signal is shorter than a signal increase period, because of which the second voltage commands Vu2*, Vv2*, and Vw2* are output in the signal decrease period, and the first voltage commands Vu1*, Vv1*, and Vw1* are output in the signal increase period.

When the signal increase period is shorter than the signal decrease period, the second voltage commands Vu2*, Vv2*, and Vw2* are output in the signal increase period, and the first voltage commands Vu1*, Vv1*, and Vw1* are output in the signal decrease period.

In FIG. 15, the voltage vectors of the inverter change in an order of V1, V2, V7, V2, V1. In order to restore 3-phase current, the voltage vectors other than V0 and V7 need to be output continuously for a predetermined period. Herein, a waiting time necessary for current detection is taken to be Tw. To what degree of length Tw should be set can be determined from a waveform of the direct current bus current.

The post-correction first voltage commands Vu1*, Vv1*, and Vw1* are practically fixed in accordance with the circumstances of current control. In FIG. 15, when an output period of V1 in the signal increase period is t1 and an output period of V2 is t2, it is not necessarily the case that both t1 and t2 are greater than the waiting time Tw, because of which the voltage vectors are fixed for the period of the waiting time Tw by the second voltage commands Vu2*, Vv2*, and Vw2* and the asymmetrical carrier signal being appropriately set.

In the signal decrease period of FIG. 15, firstly, the voltage vector is fixed at V1, and after the waiting time necessary for current detection elapses, the direct current, bus current is detected. As previously described, when V1 is being output, the direct current bus current is equivalent to a u-phase current iu. When a first direct current bias current detection is finished, the voltage vector is changed to V2, and the elapse of the waiting time necessary for current detection is awaited in this state. After the waiting time elapses, the direct current bus current is detected again. The direct current bus current when V2 is being output is equivalent to a w-phase current iw. Provided that the u-phase current iu and w-phase current iw are known, a v-phase current iv can be obtained using Kirchhoff's current law (iu+iv+iw=0).

As previously described, the first voltage command is obtained using a general control method, and harmonic distortion correction can be carried out using the method described up to the sixth embodiment.

What is important in this embodiment is how the second voltage command is set.

As previously described, the final output voltage of the inverter is determined by a time average that takes both the first voltage command and second voltage command into consideration. When taking the second voltage command to be a high frequency voltage signal with an average value of zero, the output voltage is approximately equivalent to the first, voltage command, but two disadvantages occur in this case. One disadvantage is that the maximum voltage that can be output decreases for the period for which the second voltage command is being output. The other disadvantage is that due to a high frequency voltage being applied, there is concern about problems of torque pulsation, vibration, and noise arising. In order to avoid these kinds of disadvantage, the second voltage command is determined as below in this embodiment, without insisting that the average value of the second voltage command should be zero.

Firstly, a magnitude relationship of the first voltage commands Vu1*, Vv1*, and Vw1* is investigated. Further, the second voltage command is set to a maximum value of the carrier signal, an intermediate value of the carrier signal, and a minimum value of the carrier signal in a phase order commensurate with the magnitude of the first voltage command. For example, in the case of FIG. 15, the first voltage command is greatest in the u-phase, next in magnitude is the v-phase, and the first voltage command is smallest in the w-phase, because of which the second u-phase voltage command Vu2* is set to the maximum value of the carrier signal, the second v-phase voltage command Vv2* is set to the intermediate value of the carrier signal, and the second w-phase voltage command Vw2* is set to the minimum value of the carrier signal.

When determining the second voltage command in this way, a phase difference between vectors of the first voltage command and second voltage command decreases. Because of this, a decrease in maximum voltage caused by the second voltage command is kept small, because of which the power supply voltage can be effectively utilized. As no high frequency voltage is applied, the problems of torque pulsation, vibration, and noise are unlikely to occur.

This method is such that, as the average value of the second voltage command is not zero, something of a discrepancy occurs between the first voltage command and final output voltage, but this discrepancy is easily corrected. It is sufficient that the discrepancy is calculated, and added in reverse orientation to the first voltage command. The discrepancy can be obtained by calculating the difference between the second voltage commands Vu2*, Vv2*, and Vw2* and first voltage commands Vu1*, Vv1*, and Vw1* for each phase, multiplying by the time in one cycle of the carrier signal for which the first voltage command is output, and dividing by the time for which the second voltage command is output.

Also, when actively utilizing the asymmetrical carrier signal to relatively shorten the time for which the second voltage command is output compared with the time for which the post-correction first voltage command is output, the discrepancy itself becomes smaller, because of which it may be that discrepancy correction is unnecessary.

Next, a method of determining the asymmetrical carrier signal will be described. Firstly, a carrier signal frequency fc is determined with consideration to inverter heat generation. A carrier signal cycle Tc is obtained from Tc=1/fc. It is good when the shorter period of the signal increase period and signal decrease period is set to a value the same as 2Tw, or slightly longer than 2Tw. In FIG. 15, the signal decrease period is set to practically 2Tw, and the signal increase period to practically Tc−2Tw.

The second voltage command and asymmetrical carrier signal setting methods described in this embodiment are implemented in order that phase voltage restoration is reliably and easily carried out, and current detection timing deviation and control delay are kept to a minimum.

Assuming that control starts at the instant the carrier signal reaches the maximum value, the direct current bus current is detected twice at practically the shortest timing, and the 3-phase current is restored. As update of a voltage command is normally carried out at a peak of the carrier signal, control computation needs to be finished by a timing at which the carrier signal next reaches the maximum, but provided that the 3-phase current is restored at the shortest timing in this way, time for control computation to be carried out is easily secured. Because of this, control can be carried out without using the current, of an immediately preceding sampling, because of which there is no need to extend a control delay by that amount. Also, deviation of current detection timing is kept as small as possible, because of which current restoration error is also kept small. Furthermore, as previously described, keeping the output times of the second voltage commands Vu2*, Vv2*, and Vw2* short also has the advantage of improving the voltage utilization rate of the inverter, but in addition to this, the average value of the second voltage command in this embodiment is not zero, because of which a greater voltage can be output. Because of this, rotation speed-torque characteristics of the multi-phase motor can be improved, From the above, it is thought that it is better in this case that there is a difference between the lengths of the signal increase period and signal decrease period of the carrier signal. When using an asymmetrical carrier signal, however, low-order harmonics appear noticeably when the motor frequency and carrier signal frequency are near. The greater the difference between the lengths of the signal increase period and signal decrease period, the more serious the problem of low-order harmonics becomes.

Also, this invention is easily mounted in a general calculator. The invention can be used in tandem with one-shunt current restoration technology in which an asymmetrical carrier signal is used, and provides a motor drive system with a low-cost device configuration and low vibration and noise. Also, as harmonics caused by an asymmetrical triangular wave can be restricted without increasing carrier signal frequency, switching loss is reduced, and the size of a heat dissipating part can be reduced.

In the seventh embodiment, a description has been given with the multi-phase motor 1b as a 3-phase motor and the multi-phase power conversion circuit 31 as a voltage type 3-phase inverter, but the same kinds of thing can be achieved without problem with a motor or power conversion circuit of four phases or more. Also, in FIG. 14, the harmonic voltage distortion correcting means 6 corrects only the first voltage command, but may, in the same way, correct the second voltage command in addition to the first voltage command.

The embodiments can be freely combined, and an arbitrary component of each embodiment can be changed or omitted as appropriate, without departing from the scope of the invention.

The invention claimed is:

1. A power conversion device, comprising:
   a power conversion circuit that carries out power conversion in accordance with a switching operation of a semiconductor device;
   an asymmetrical waveform carrier signal generator that generates an asymmetrical waveform carrier signal such that a signal decrease period necessary for the carrier signal to change from a maximum value to a minimum value and a signal increase period necessary for the carrier signal to change from the minimum value to the maximum value differ;
   a command value generator that generates a sinusoidal command value;
   a command value corrector that receives the asymmetrical waveform carrier signal from the asymmetrical waveform carrier signal generator and the sinusoidal command value from the command value generator, corrects the sinusoidal command value based on the asymmetrical waveform carrier signal, and outputs a post-correction command value; and
   a comparator that compares the post-correction command value from the command value corrector and the asymmetrical waveform carrier signal, and determines a gate signal of the switching operation of the power conversion circuit.

2. The power conversion device according to claim 1, wherein
   the command value corrector is harmonic voltage distortion corrector that corrects a command value of an output of the power conversion circuit using harmonics generated by the asymmetrical waveform carrier signal, and
   the harmonic voltage distortion corrector restricts a second order harmonic among the harmonics.

3. The power conversion device according to claim 2, wherein the harmonic voltage distortion corrector includes a subtractor, the harmonic is subtracted from the command value in the subtractor, and the post-correction command value is output to the comparator.

4. The power conversion device according to claim 3, wherein the harmonic voltage distortion corrector includes a harmonic reference device that references a harmonic component generated by the asymmetrical waveform carrier signal based on the command value and outputs a corrective signal, corrects the command value using the corrective signal, and outputs the post-correction command value.

5. The power conversion device according to claim 3, wherein the harmonic voltage distortion corrector includes a harmonic computer that computes a harmonic from the command value and asymmetrical waveform carrier signal, subtracts a calculated harmonic signal from the command value, and outputs the post-correction command value.

6. The power conversion device according to claim 3, comprising:
 a detector that detects an output of the power conversion circuit;
 a harmonic extractor that extracts a harmonic distortion generated by the asymmetrical waveform carrier signal from a detected value acquired from the detector; and
 a controller that sets a corrective signal in accordance with an output of the harmonic extractor.

7. The power conversion device according to claim 6, wherein the harmonic voltage distortion corrector includes a harmonic reference device that references a harmonic component generated by the asymmetrical waveform carrier signal based on the command value and outputs a corrective signal, corrects the command value using the corrective signal and sets a first corrective signal, adopts a corrective signal set by the controller as a second corrective signal, corrects the command value using the first corrective signal and second corrective signal, and outputs the post-correction command value.

8. The power conversion device according to claim 1, wherein
 the power conversion circuit is a multi-phase power conversion circuit that can supply direct current power and multi-phase alternating current power in two directions,
 the command value generator generates a first command as a command value,
 the power conversion device comprises:
  a direct current bus current detector provided in the multi-phase power conversion circuit;
  a phase current restorer that restores phase current flowing to a multi-phase alternating current side from a switching pattern of the multi-phase power conversion circuit and a direct current bus current detected by the direct current bus current detector;
  a second command compiler that outputs a second command for restoration of the phase current; and
  a voltage command selector that selects which command of the post-correction command value from the command value corrector and the second command is to be transmitted to the comparator, and
 the voltage command selector outputs the second command in the shorter period of the signal increase period and the signal decrease period of the asymmetrical waveform carrier signal.

* * * * *